(12) United States Patent
Kim

(10) Patent No.: US 11,646,330 B2
(45) Date of Patent: May 9, 2023

(54) UNIT CELL OF DISPLAY PANEL INCLUDING INTEGRATED TFT PHOTODETECTOR

(71) Applicant: Hoon Kim, La Habra, CA (US)

(72) Inventor: Hoon Kim, La Habra, CA (US)

( * ) Notice: Subject to any disclaimer, the term of this patent is extended or adjusted under 35 U.S.C. 154(b) by 269 days.

(21) Appl. No.: 16/729,445

(22) Filed: Dec. 29, 2019

(65) Prior Publication Data

US 2021/0057465 A1 Feb. 25, 2021

Related U.S. Application Data

(60) Provisional application No. 62/889,560, filed on Aug. 20, 2019.

(51) Int. Cl.
| | |
|---|---|
| *H01L 21/00* | (2006.01) |
| *H01L 27/146* | (2006.01) |
| *G02F 1/1333* | (2006.01) |
| *G02F 1/13357* | (2006.01) |
| *H01L 27/32* | (2006.01) |
| *H01L 31/036* | (2006.01) |
| *H01L 31/113* | (2006.01) |
| *G06F 3/041* | (2006.01) |
| *G06F 3/042* | (2006.01) |
| *G06V 40/13* | (2022.01) |
| *G02F 1/133* | (2006.01) |

(52) U.S. Cl.
CPC ...... *H01L 27/1461* (2013.01); *G02F 1/13338* (2013.01); *G02F 1/133606* (2013.01); *G06F 3/0421* (2013.01); *G06F 3/04182* (2019.05); *G06F 3/041662* (2019.05); *G06V 40/1318* (2022.01); *H01L 27/14612* (2013.01); *H01L 27/14616* (2013.01); *H01L 27/14689* (2013.01); *H01L 27/323* (2013.01); *H01L 31/036* (2013.01); *H01L 31/1136* (2013.01); *G02F 1/13318* (2013.01); *H01L 27/3227* (2013.01); *H01L 27/3234* (2013.01)

(58) Field of Classification Search
CPC .......... H01L 27/1461; H01L 27/14612; H01L 27/14616; H01L 27/14689; H01L 27/323; H01L 31/036; H01L 27/3227; H01L 27/3234; G06F 3/041662; G06F 3/04182; G06F 1/133606; G06F 3/0421; G06V 40/1318; G02F 1/13338; G02F 1/13318
See application file for complete search history.

(56) References Cited

U.S. PATENT DOCUMENTS

| | | | |
|---|---|---|---|
| 2007/0229452 A1 | 10/2007 | Sano et al. | |
| 2016/0128653 A1 | 5/2016 | Fortuna et al. | |
| 2017/0337413 A1* | 11/2017 | Bhat | ................. G06V 40/1318 |
| 2018/0032778 A1 | 2/2018 | Lang | |
| 2018/0069127 A1* | 3/2018 | Yang | ................. H01L 29/78603 |
| 2019/0311256 A1 | 10/2019 | Hack | |
| 2020/0264728 A1 | 8/2020 | Qin et al. | |

(Continued)

*Primary Examiner* — Richard A Booth
(74) *Attorney, Agent, or Firm* — Dentons US LLP

(57) ABSTRACT

A unit pixel arranged along with a display pixel in each pixel of a display panel is provided. The unit pixel may include a thin-film transistor (TFT) photodetector including an active layer formed of amorphous silicon or polycrystalline silicon on an amorphous transparent substrate, and at least one transistor electrically coupled to the TFT photodetector and configured to generate a voltage output from photocurrent generated from the active layer.

15 Claims, 14 Drawing Sheets

(56) References Cited

U.S. PATENT DOCUMENTS

2020/0373338 A1* 11/2020 Okhonin .......... H01L 27/14647
2020/0395421 A1 12/2020 He et al.
2020/0401269 A1 12/2020 Reynolds

* cited by examiner

UNIT CELL OF DISPLAY PANEL INCLUDING INTEGRATED TFT PHOTODETECTOR

CROSS-REFERENCE TO RELATED APPLICATIONS

The present application claims priority to U.S. Application No. 62/889,560 filed on Aug. 20, 2019, which is incorporated herein by reference.

TECHNICAL FIELD

The present disclosure relates to a unit pixel of a display panel including an integrated thin film transistor (TFT) photodetector, and more particularly, to a unit pixel stacked with a display pixel or arranged side by side with the display pixel, in each pixel of a display panel.

BACKGROUND

Technologies such as liquid crystals, organic light emitting diode (OLED) cells, touch screens, backlights, and thin film transistors (TFTs) on glass are integrated on a display panel. Particularly, the trend of recent mobile devices is toward a display panel which tends to be as large as or larger than an overall device size, and a display itself is becoming more flexible.

However, the current display system performs only a one-way function of outputting an image or the like to the outside, without a function of efficiently, directly acquiring an input signal. At present, the display system executes only a touch screen function, while a separate image sensor performs a process such as image sensing.

Particularly in a mobile device or a laptop computer to which a biometric recognition and authentication system such as fingerprint or face recognition and authentication is essential, there are technological limitations in acquiring a signal from an image sensor confined to any specific position on a display. Although it is most desirable to incorporate an input signal device into the display system, an image sensor cannot be implemented on a display panel with the current technology, thus making it impossible to integrate the display panel with the image sensor in real implementation.

The above information is presented as background information only to assist with an understanding of the present disclosure. No determination has been made, and no assertion is made, as to whether any of the above might be applicable as prior art with regard to the present disclosure.

SUMMARY

An aspect of the present disclosure is to address at least the above-mentioned problems and/or disadvantages and to provide at least the advantages described below. Accordingly, an aspect of the present disclosure is to provide a high-sensitivity image sensor on a glass substrate or a flexible substrate such as a polyimide film, which is used as a display anel, by a thin-film transistor (TFT) fabrication technology.

Another aspect of the present disclosure is to enable a display module to function as an image sensor without the need for a separate image sensor on the display panel.

Another aspect of the present disclosure is to perform an image sensing process without the need for separately providing a light emitting part for an image sensor, by using a light emitting device or backlight unit (BLU) of a display as a light source for the image sensor.

Another aspect of the present disclosure is to realize a transparent display panel capable of displaying and image sensing by stacking a screen panel of a display and an image sensing panel or arranging the screen panel and the image sensing panel on the same panel.

Another aspect of the present disclosure is to fabricate a switching TFT for display and a driving TFT for image sensing in a single process by arranging a screen panel and an image sensing panel on the same panel.

Another aspect of the present disclosure is to use a light source for a display also as a light source for an image sensor.

Another aspect of the present disclosure is to use both of a BLU of a liquid crystal display (LCD) and a light emitting source of an organic light emitting diode (OLED).

In accordance with an aspect of the present disclosure, a unit pixel arranged along with a display pixel in each pixel of a display panel may include a TFT photodetector including an active layer formed of amorphous silicon or polycrystalline silicon on an amorphous transparent substrate, and at least one transistor electrically coupled to the TFT photodetector and configured to generate a voltage output from photocurrent generated from the active layer.

The TFT photodetector may be configured in a structure in which when light is incident, electrons are introduced into an N-type gate by tunneling from a P-type active layer to an insulating oxide film, among charges of two PN areas excited with the insulating oxide film in between, the electron migration changes a threshold voltage of a current channel between a source and a drain in correspondence with a change in the total amount of charge in the gate, the photocurrent proportional to the intensity of the received light flows in the active layer, and the voltage output is generated form the flowing photocurrent.

The active layer may contain a material with a conductive property controllable by tunneling or an electric field.

The active layer may contain at least one of amorphous silicon or polycrystalline silicon.

The at least one transistor may convert the photocurrent into the voltage output based on parasitic capacitance between the at least one transistor, caused by the photocurrent generated from the active layer.

The at least one transistor may include a select transistor, and when the select transistor is turned on, the parasitic capacitance may be generated.

The at least one transistor may convert photocurrent into the voltage output, the photocurrent being generated by directly charging a capacitor coupled to a transistor corresponding to a source follower with the photocurrent generated from the active layer.

The at least one transistor may include a select transistor. When the select transistor is turned on, a capacitor of an IVC circuit may be charged, among capacitors coupled to the transistor corresponding to the source follower, and the charged photocurrent may be converted into a voltage which is an output of the IVC circuit.

A pixel structure may be determined based on a thickness of the active layer.

The unit pixel may further include a transistor coupled to the active layer and configured to control residual charges in a neutral area, when the thickness of the active layer is equal to or larger than a reference value.

The reference value may be 100 nm.

The TFT photodetector may include an amorphous transparent substrate used as a display panel, a source formed of amorphous silicon or polycrystalline silicon on the transparent substrate, a drain formed of amorphous silicon or polycrystalline silicon, opposite to the source on the transparent substrate, an active layer formed between the source and the drain and having a current channel formed between the source and the drain, an insulating oxide film formed on the source, the drain, and the active layer, and a light receiving part formed on the insulating oxide film, isolated from the active layer by the insulating oxide film, and configured to absorb light.

In the TFT photodetector, when light is incident on the light receiving part, electrons may migrate by tunneling through the insulating oxide film between the light receiving part and the active layer which have been excited with the insulating oxide film in between, the amount of charge in the light receiving part may be changed by the migration of the electrons, a threshold voltage of the current channel may be changed due to the change of the amount of charge, and photocurrent may flow through the current channel due to the change of the threshold voltage.

The TFT photodetector may use light generated from the display panel as a light source for a sensor.

In another aspect of the present disclosure, a unit pixel of a display panel may include a display sub-panel including a light emitting device, and an image sensor sub-panel stacked with the display sub-panel, and configured to generate a voltage output from photocurrent generated from an active layer in response to sensed light. The image sensor sub-panel may include a TFT photodetector including an active layer formed of amorphous silicon or polycrystalline silicon on an amorphous transparent substrate, and at least one transistor electrically coupled to a source side of the TFT photodetector and configured to generate a voltage output from photocurrent generated from the active layer.

The image sensor sub-panel may be configured in a structure in which when light is incident, electrons are introduced into an N-type gate by tunneling from a P-type active layer to an insulating oxide film, among charges of two PN areas excited with the insulating oxide film in between, the electron migration changes a threshold voltage of a current channel between a source and a drain in correspondence with a change in the total amount of charge in the gate, the photocurrent proportional to the intensity of the received light flows in the active layer, and the voltage output is generated form the flowing photocurrent.

In another aspect of the present disclosure, a unit pixel of a display panel may include a display sub-panel including a light emitting device, and an image sensor sub-panel formed near to the display sub-panel on the same layer, and configured to generate a voltage output from photocurrent generated from an active layer in response to sensed light. The image sensor sub-panel may include a TFT photodetector including an active layer formed of amorphous silicon or polycrystalline silicon on an amorphous transparent substrate, and at least one transistor electrically coupled to a source side of the TFT photodetector and configured to generate a voltage output from photocurrent generated from the active layer.

The unit pixel may further include a driving switch. The driving switch may control driving of the display sub-panel or control the image sensor sub-panel.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF THE DRAWINGS

The above and other aspects, features and advantages of certain exemplary embodiments of the present disclosure will be more apparent from the following description taken in conjunction with the accompanying drawings, in which.

DETAILED DESCRIPTION

The present disclosure will be described in detail with reference to the attached drawings. Lest it should obscure the subject matter of the present disclosure, a known technology will not be described in detail. An ordinal number (e.g., first, second, and so on) used in the description of the present disclosure is used simply to distinguish one component from another component.

When it is said that one component is "coupled to or with" or "connected to" another component, it is to be understood that the one component may be coupled to or connected to the other component directly or with a third party in between.

Figure 1:
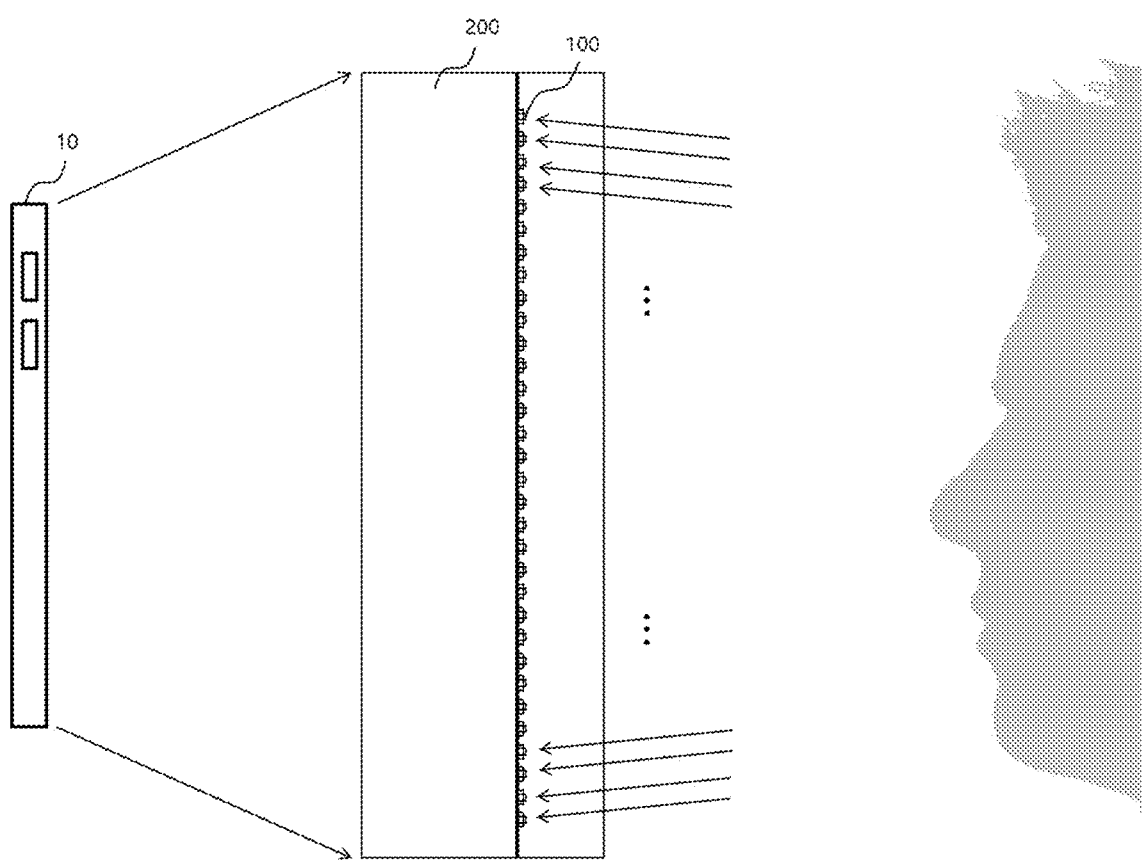
FIG. 1 is a schematic diagram illustrating a display module with thin film transistor (TFT) photodetectors implemented thereon, which is used as an image sensor, in an electronic device according to an embodiment of the present disclosure.

FIG. 1 is a schematic diagram illustrating a display module with thin film transistor (TFT) photodetectors implemented thereon, which is used as an image sensor, in an electronic device according to an embodiment of the present disclosure.

A TFT photodetector 100 according to the present disclosure is formed on a display panel 200 of an electronic device 10. The electronic device 10 may be any of devices equipped with a display, such as a smartphone, a laptop computer, a monitor, or a TV.

Specifically, TFT photodetectors 100 may be formed across the whole or part of the display panel 200, and a TFT photodetector 100 may be formed in each individual pixel, thus operating as a part of the pixel. When TFT photodetectors 100 are formed across the whole display panel 200, the number of the TFT photodetectors 100 may be equal to the number of pixels corresponding to the resolution of the display panel 200. The display panel 200 may be any of a light receiving display requiring a backlight unit (BCU), such as a liquid crystal display (LCD) or a light emitting display which emits light on its own, such as a light emitting diode (LED) (e.g., organic LED (OLED) or active matrix OLED (AMOLED)) display or a plasma display panel (PDP).

The display panel 200 displays a video or an image or operates as an image sensor, according to an operation of the electronic device 10. When the display panel 200 operates as an image sensor, an optical image of an external object may be acquired by means of a plurality of TFT photodetectors 100 implemented on the display panel 200. A light source required for image sensing may be an external light source such as natural light or an external lighting, or an internal light source such as a BCU or OLED elements of the display panel 200.

As such, formation of TFT photodetectors 100 of the present disclosure on the display panel 200 advantageously enables use of the display panel 200 as an image sensor without the need for providing a separate image sensor in the electronic device 10. Further, because the display panel 200 is used as an image sensor, a light source for display may also be used as a light source for image sensing without the need for adding a light source for image sensing in the electronic device 10. Therefore, the effects of device simplification and reduced fabrication cost may be expected.

Further, because the pixels of the image sensor are formed in the same size as the pixels of the display, as many image sensor pixels as the number of pixels corresponding to the resolution of the display may be arranged in the electronic device 10. In this case, the whole display may serve as an image sensor. The electronic device 10 may acquire an image of an external object by controlling image sensor pixels in the whole or part of the display. Hereinbelow, an image sensor pixel is interchangeably used with a unit pixel of the image sensor. Obviously, the TFT photodetector 100 of the present disclosure is formed in a unit pixel of the image sensor. Further, a unit pixel of the display panel is interchangeably used with a display pixel. The unit pixel will be described in detail with reference to FIG. 9.

Further, the electronic device 10 may acquire biometric information about an external object, such as information about the fingerprint of a finger, a finger vein, a face, or an iris by the display panel 200 with TFT photodetectors 100 formed thereon. For example, a user may touch his or her finger on any area of the display or place the finger within a predetermined distance from the area of display in the electronic device 10, so that a fingerprint image may be acquired from a plurality of image sensor pixels formed in the area of the display. Throughout the specification, the display panel 200 may be referred to as a display or a screen panel of a display.

Now, a description will be given of formation of TFT photodetectors on a display panel.

Figure 2:
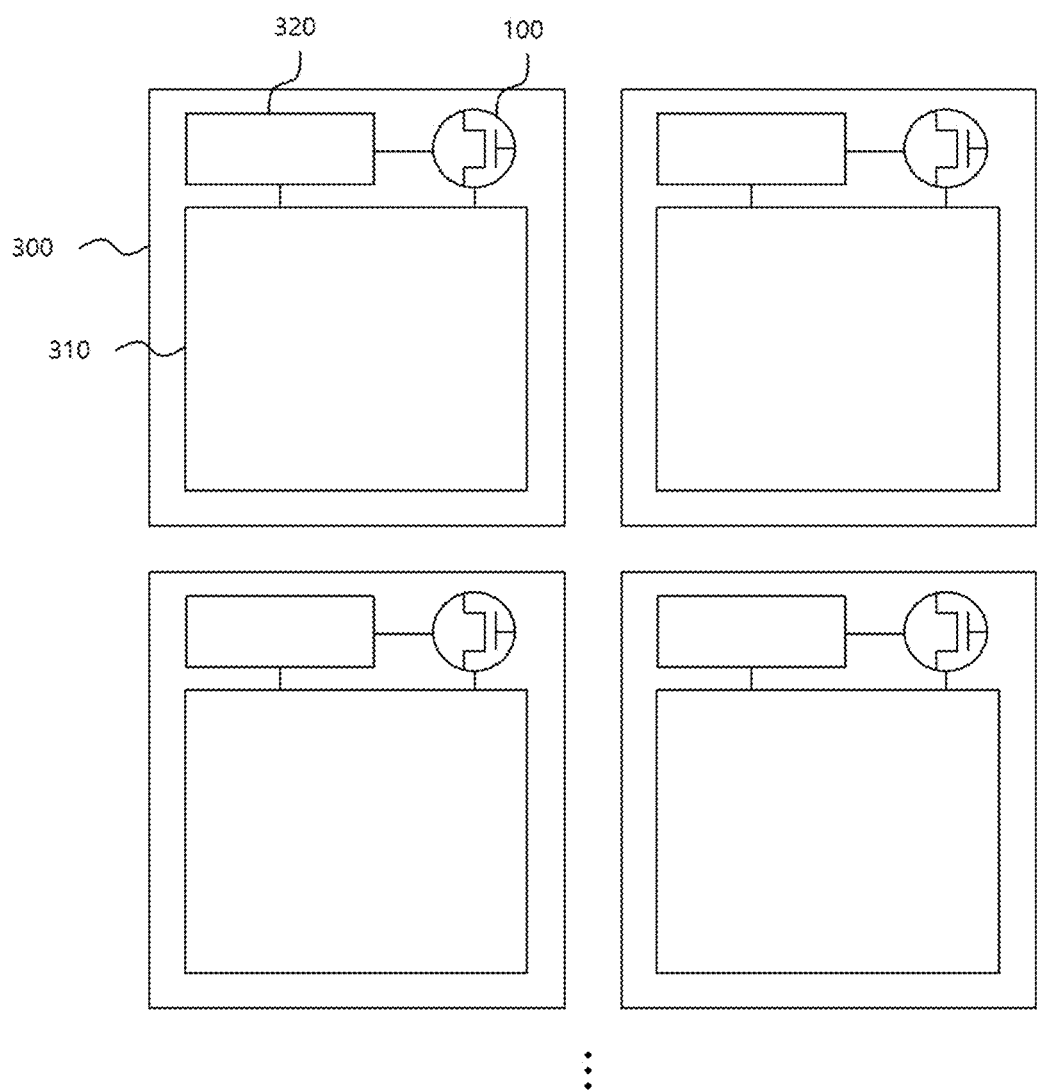
FIG. 2 is a diagram illustrating an exemplary TFT photodetector implemented on a pixel basis according to an embodiment of the present disclosure.

FIG. 2 is a diagram illustrating exemplary formation of a TFT photodetector in each pixel of a display according to an embodiment of the present disclosure.

Although the TFT photodetector 100 of the present disclosure operates in a similar principle to that of a photo assisted tunneling-photodetector (PAT-PD) disclosed in U.S. patent application Ser. No. 15/885,757, the TFT photodetector 100 and the PAT-PD are different in that the PAT-PD is formed on a single crystalline silicon substrate, and an active layer, a source, a drain, and a gate serving as a light receiving part are formed of single crystalline silicon, whereas the TFT photodetector 100 is formed on the display panel 200 which is a glass substrate or a transparent flexible substrate using a transparent film formed of, for example, polyimide (PI), polyethylene terephthalate (PET), polypropylene (PP), polycarbonate (PC), polymethylmethacrylate (PMMA), polyethylenenaphthalate (PEN), polyetheretherketone (PEEK), polyethersulfone (PES), or polyarylite, and an active layer, a source, a drain, and a light receiving part are formed of amorphous silicon (a-Si) or polycrystalline (poly-Si) silicon. Glass or a PI film is amorphous, which makes it impossible to stack single crystalline silicon thereon. Therefore, when TFT photodetectors are formed on a glass substrate or a flexible substrate, the TFT photodetectors should be implemented in an amorphous or polycrystalline fashion. Under circumstances, the amorphous silicon or the polycrystalline silicon may be replaced with a material with a conductive property controllable by an electric field or tunneling. Throughout the specification, the term "PAT-PD" or "TFT PAT-PD" is interchangeably used with "TFT photodetector".

Preferably, display pixels and image sensor pixels are matched to each other in a one-to-one correspondence. FIG. 2 illustrates an exemplary pixel structure of the display panel 200 with TFT photodetectors 100 formed thereon. A unit pixel 300 of the display panel 200 includes a light emitting area 310 for display, a switching TFT 320, and a TFT photodetector 100 for image sensing. The display panel 200 may be designed such that each unit pixel of the display panel and each unit pixel of the image sensor occupy areas of similar sizes and thus the display pixels and the image sensor pixels may be matched in a one-to-one correspondence per position. In this case, as the TFT photodetector 100 may operate, using the light emitting area 310 of the display pixel as a light source, a signal may be processed by matching the light emitting area 310 to the TFT photodetector 100, and data may be processed by matching data included in the light source to data collected by the TFT photodetector 100.

Although it is preferable to form the TFT photodetector 100 without any overlap with the light emitting area 310, the TFT photodetector 100 may be formed overlapping with the light emitting area 310 over a predetermined area because the TFT photodetector 100 occupies a small area relative to the light emitting area 310. However, to maximize photoelectric conversion, the introduction of unnecessary light is blocked by shielding an area except for the light receiving part of the TFT photodetector 100 with a metal or the like. The resulting shielding of a part of the light emitting area 310 with the light shielding area except for the light receiving part of the TFT photodetector 100 may decrease the light emission efficiency of the display.

In some cases, the display pixels and the image sensor pixels may be configured in different sizes. For example, when the unit pixels of the image sensor are designed such that one display pixel area corresponds to n image sensor pixels, n TFT photodetectors 100 share the light emitting area of one display pixel as a light source, making it difficult to control the TFT photodetectors 100 individually by light source control. However, the light source control may be simplified, which in turn simplifies an image sensing process. On the contrary, the unit pixels of the image sensor may be designed such that the area of one unit pixel of the image sensor corresponds to m display pixels. In this case, although fewer image sensor pixels than the number of pixels corresponding to the resolution of the display may be arranged, one TFT photodetector 100 uses the light emitting areas of m display pixels as light sources, and thus fine light source control required for image sensing and data processing may become difficult.

The light emitting area 310 may be formed in a different structure according to the type of a used display For example, when the display panel 200 of the electronic device 10 is a light emitting display such as an organic light emitting diode (OLED) display, the light emitting area 310 may be a light emitting pixel with red, green, blue (RGB) sub-pixels arranged therein. When the display panel 200 of the electronic device 10 is a light receiving display such as a liquid crystal display (LCD), RGB sub-filters may be arranged in the light emitting area 310. Obviously, the TFT photodetector 100 may use an external light source such as natural light as a light source for image sensing, instead of the light emitting area 310.

With reference made to FIG. 2 again, a plurality of unit pixels 300 are arranged in a lattice structure. Each unit pixel 300 may be formed by vertically stacking or arranging side by side a display sub-panel formed on a glass substrate or a transparent flexible substrate and an image sensor sub-panel formed on a glass substrate or a transparent flexible substrate. In this regard, FIG. 3 illustrates a cross section of a unit pixel 300 of the display.

Figure 3:
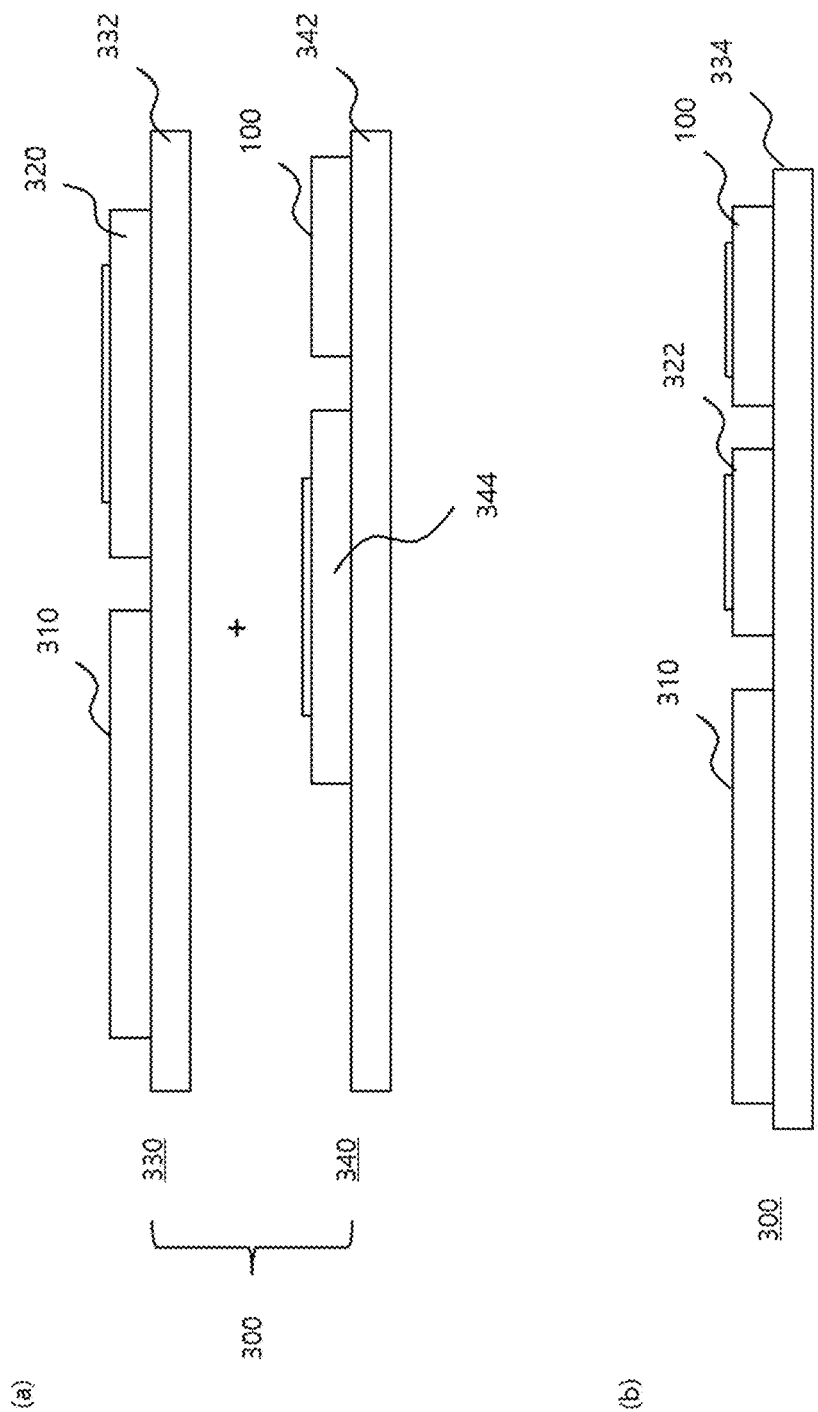
FIG. 3 is a sectional view illustrating exemplary implementations of a TFT photodetector on a pixel basis on a display according to an embodiment of the present disclosure.

Referring to FIG. 3, the unit pixel 300 of the display panel includes a display sub-panel 330 and an image sensor sub-panel 340. The display sub-panel 330 may include a light emitting area 310 for display and its switching TFT 320, and the image sensor sub-panel 340 may include a TFT photodetector 100 for image sensing and a detector driving TFT 344 for driving the TFT photodetector 100.

For example, the detector driving TFT 344 may include at least one transistor which is electrically coupled to a source side of the TFT photodetector 100, and generates a voltage output from photocurrent generated in the active layer of the TFT photodetector 100.

The display sub-panel 330 or the image sensor sub-panel 340 is formed on a transparent glass substrate or a transparent flexible substrate such as a PI film (hereinafter, a glass substrate and a transparent substrate are interchangeably used with each other). The transparent display panel 200 may be formed by vertically stacking and attaching the two panels as illustrated in FIG. 3(a) or arranging the two panels side by side on the same glass substrate 334 as illustrated in FIG. 3(b).

Particularly, the image sensor sub-panel 340 may be stacked with the display sub-panel 330 in the structure of FIG. 3(a). Further, in response to light sensed by the image sensor sub-panel 340, a voltage output may be generated from photocurrent generated from the active layer.

When light is incident on the image sensor sub-panel 340, electrons are introduced into an N-type gate by tunneling from a P-type active layer to an oxide film, among charges of two PN areas excited with the oxide layer in between. The electron migration changes the threshold voltage of a current channel between a source and a drain in correspondence with a change in the total amount of charge in a gate, and thus photocurrent corresponding to the intensity of the incident light flows in the active layer. Further, the image sensor sub-panel 340 may generate a voltage output from the flowing photocurrent.

Alternatively, the light emitting area 310 and the switching TFT 320 of an OLED device for display, and the TFT photodetector 100 for image sensing and the detector driving TFT 344 may be arranged together on the same glass substrate 332 or 342, as illustrated in FIG. 3(b). In this case, a driving switch 322 may be formed by incorporating a switching TFT for controlling the light emitting area 310 with a switching TFT for controlling the TFT photodetector 100, or the switching TFTs may be formed separately.

Throughout the specification, the display sub-panel 330 and the image sensor sub-panel 340 may also be referred to as a display pixel and an image sensor pixel, respectively.

As described before, the image sensor pixel 340 of a similar size to that of the display pixel 330 senses light and acquires an image by signal processing and detector driving, and includes the TFT photodetector 100 and the detector driving TFT 344 for driving the TFT photodetector 100. The switching TFT 320 for an output to be used for display, and the detector driving TFT 344 for driving the TFT photodetector 100 formed on an image sensor pixel basis may be integrated or configured separately. In this manner, the TFT photodetector 100 of the present disclosure is formed on a pixel basis.

Because the TFT photodetector 100 should be formed on an amorphous substrate such as a glass substrate or a PI film, not a single crystalline silicon substrate, the TFT photodetector 100 should be implemented in a different manner from an existing photodetector using single crystalline silicon. Now, a description will be given of a detailed structure, operation mechanism, fabrication method of a TFT photodetector according to the present disclosure.

Figure 4:
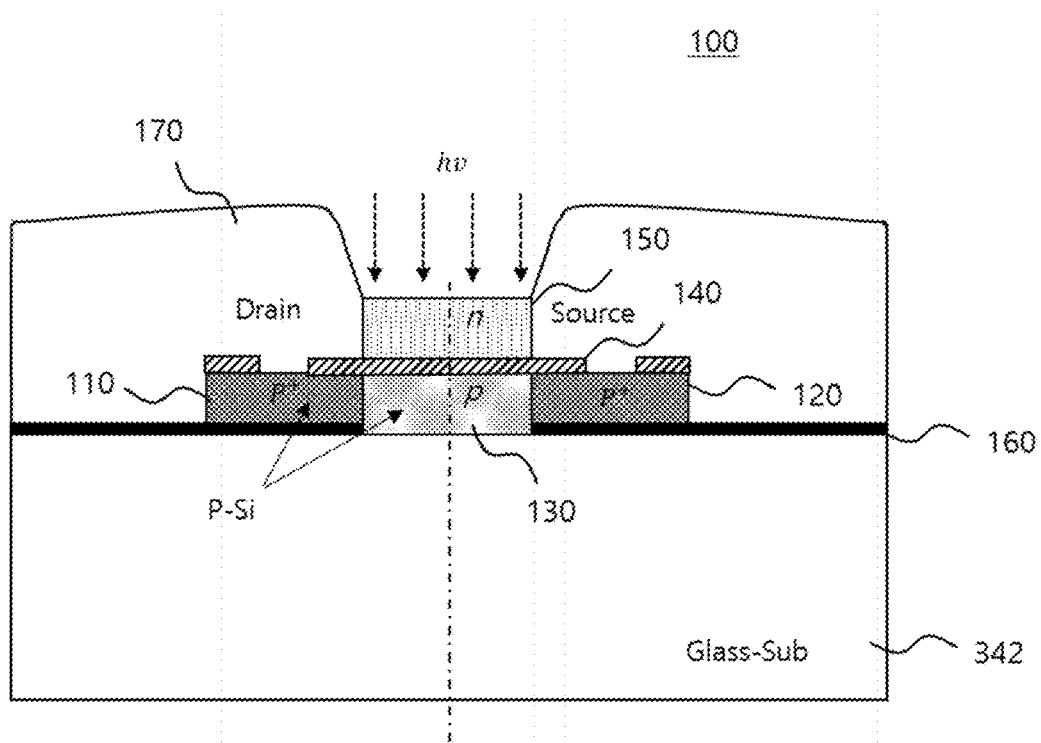
FIG. 4 is a sectional view illustrating a TFT photodetector according to an embodiment of the present disclosure.

FIG. 4 is a sectional view illustrating a TFT photodetector according to an embodiment of the present disclosure.

Referring to FIG. 4, the TFT photodetector 100 of the present disclosure is formed on the transparent substrate 342 such as an amorphous glass substrate or a flexible substrate, and includes a gate 150 formed of a-Si or poly-Si on the transparent substrate 342, an insulating oxide film 140 capable of controlling tunneling of optically excited charges, a drain 110, a source 120, and an active layer 130 in which a current channel is formed between the source 120 and the drain 110. While the drain 110, the source 120, the active layer 130, and the gate 150 are formed of a-Si or poly-Si, they may be formed of any other material as far as the material has a conductive property controllable by tunneling or an electric field.

The gate 150 is formed of N-type poly-Si or a-SI by implanting an N-type impurity and operates as a light receiving part that absorbs incident light. The active layer 130 is formed of P-type poly-Si or a-Si, with the insulating oxide film 140 between the active layer 130 and the gate 150. The active layer 130 forms a current channel according to optical excitation between the drain 110 and the source 120 which are P+-type diffusion layers.

An area on which light is incident is confined to the gate 150 serving as the light receiving part and the active layer 130 between which and the gate 150 the insulating oxide film 140 is interposed. For this purpose, a metal protection layer 160 may be formed on a boundary surface of the transparent substrate 342, except for the area between the transparent substrate 342 and the active layer 130, to shield unnecessary light introduced into the TFT photodetector 100. A metal shielding layer 170 may be formed in the remaining area except for the gate 150 in an upper part of the TFT photodetector 100. The shielding layer 170 may be formed by a silicide and metal process. The TFT photodetector 100 limits an area on which light is incident to the gate 150 serving as the light receiving part by means of the shielding layer 170, thereby maximizing the photoelectric change of the gate 150. Hereinbelow, the gate 150 and the light receiving part are interchangeably used throughout the specification.

In a state where no light is introduced, the TFT photodetector 100 controls biases of the gate 150, the drain 110, the source 120, and the active layer 130 to maintain a stable equilibrium state in which electrons are trapped. For this purpose, the metal protection layer 160 is provided on the boundary surface between the overlying shielding layer 170 and the transparent substrate 342 to shield unintended unnecessary light through the transparent substrate 342 of, for example, glass. Specifically, the active layer 130 between the source 120 and the drain 110 is bias-controlled to have a threshold voltage at which the potential state of a silicon surface on which a current channel may be formed in an initial fabrication process is shortly before a sub-threshold state. In this state, when light is not incident on the gate 150 as the light receiving part, photocurrent does not flow in the current channel.

When light is incident on the light receiving part, electrons are introduced into the N-type gate 150 by tunneling from the P-type active layer 130 to the insulating oxide film 140, among charges of the two PN areas excited with the insulating oxide layer 140 in between, the electron migration changes the threshold voltage of the current channel between the source 120 and the drain 110 in correspondence with a change in the total amount of charge in the gate 150, the threshold voltage modulation effect caused by the change in the amount of charge in the light receiving part causes a change in the conductance of the current channel, and thus photocurrent corresponding to the changed conductance flows.

Since the gate 150 is doped with holes, the electrons passed through the insulating oxide film 140 by tunneling are combined with holes in an area of the gate 150 near to the insulating oxide film 140, thereby generating a depletion layer at the top end of the insulating oxide film 140. Therefore, the threshold voltage drops due to a change in the charge of the active layer 130 near to the insulating oxide film 140, thereby exciting the current channel between the source 120 and the drain 110.

In other words, current that flows in the current channel excited between the source 120 and the drain 110 by light reception at the light receiving part is not a direct flow of charges of electron-hole pairs (EHPs) caused by the light reception but an indirect current flow in the current channel excited by tunneling of directly generated charges. Therefore, a very high-efficiency light detection capability may be achieved.

Figure 5:
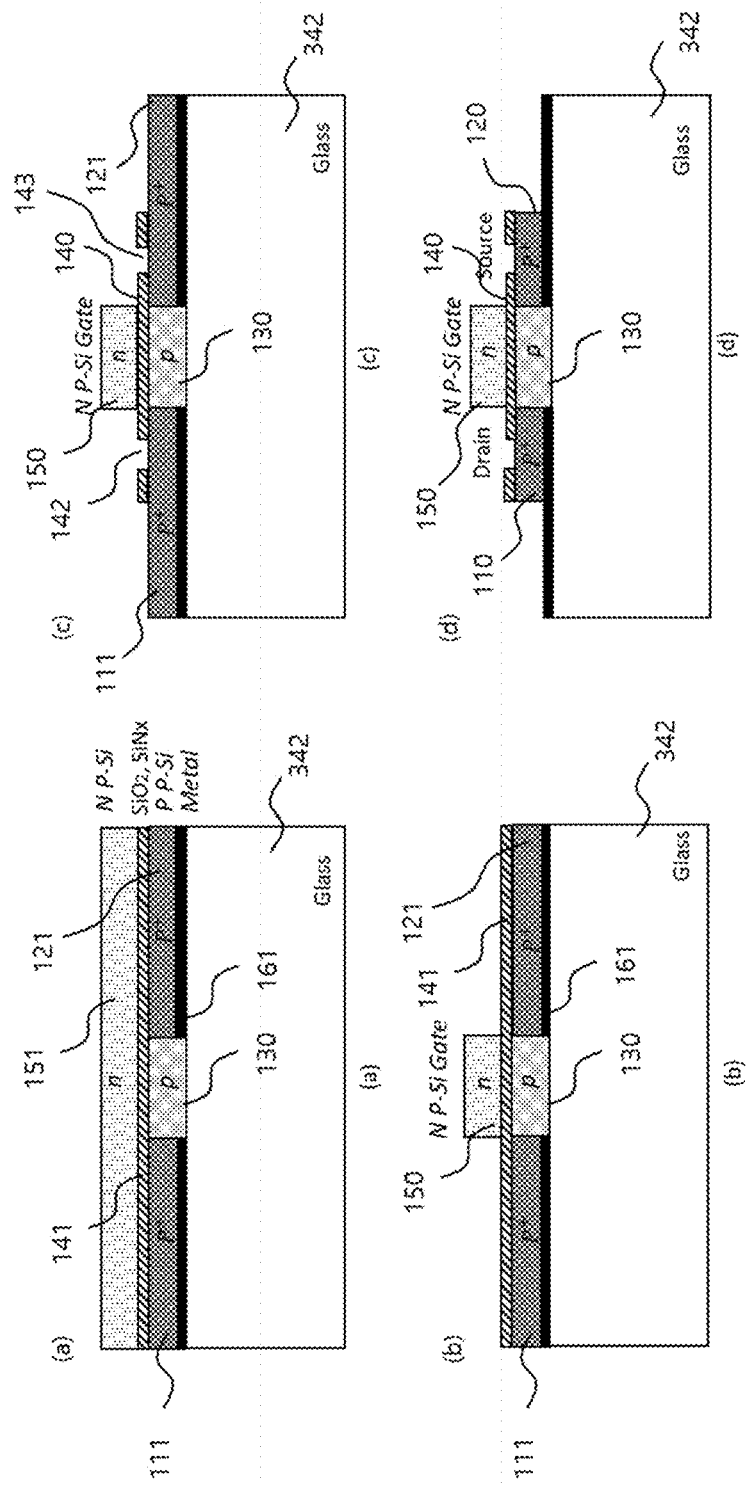
FIG. 5 is sectional views illustrating a process of fabricating a TFT photodetector according to an embodiment of the present disclosure.

FIG. 5 is a sectional view illustrating a process of fabricating a TFT photodetector according to an embodiment of the present disclosure.

In FIG. 5(a), the P-type poly-Si or a-Si diffusion layer 130 to be used as an active layer is formed on the glass substrate 342 or a flexible substrate of, for example, a PI film, and two P+-type diffusion layers 111 and 121 are formed of a-SI or poly-Si at both sides of the diffusion layer 130.

The diffusion layers 130, 111, and 121 may be formed of a-SI or poly-Si. To increase mobility, the diffusion layers 130, 111, and 121 may be formed by depositing a-SI and then crystallizing the deposited a-Si into poly crystals by thermal treatment such as laser annealing, or directly depositing poly-Si on a transparent substrate.

Subsequently, a thin $SiO_2$ or SiNx insulating oxide layer 141 is formed on the diffusion layers 130, 111, and 121. The insulating oxide layer 141 may be formed by sputtering or plasma enhanced chemical vapor deposition (PECVD).

Subsequently, an N-type diffusion layer 151 is formed of poly-SI or a-Si on the insulating oxide film 141 in the same manner.

Referring to FIG. 5(b), the gate 150 is then formed for use as a light receiving part by photo-patterning the generated diffusion layer 151. Referring to FIG. 5(c), only the generated insulating oxide layer 141 is etched away, remaining only a necessary part by a photoresist (PR) patterning process. Partial insulating oxide films 142 and 143 are removed together on areas of the diffusion layer 121, which are to be used as the source 120 and the drain 110, so that a source electrode and a drain electrode may be connected.

Referring to FIG. 5(d), the remaining area except for the areas to be used as the source 120 and the drain 110 is then removed from the P+-type diffusion layers 111 and 121 by etching. Electrodes are formed by depositing a metal or the like in the areas of the insulating oxide films 142 and 143 which have been removed in the source 120 and the drain 110.

In the TFT photodetector 100 fabricated in the above manner, current flows through a current channel excited between the source 120 and the drain 110 by tunneling, as described before. If the thickness of the active layer 130 is equal to or larger than a predetermined thickness, for example, 100 nm, a neutral area is produced separately in an area under the gate 150, which has not been depleted perfectly, except for the current channel generated by light. Unnecessary extra charges generated by light may be accumulated in the neutral area, and are likely to act as a changing factor to the threshold voltage which is linearly changed by light. Therefore, the extra charges need to be processed separately.

Figure 6:
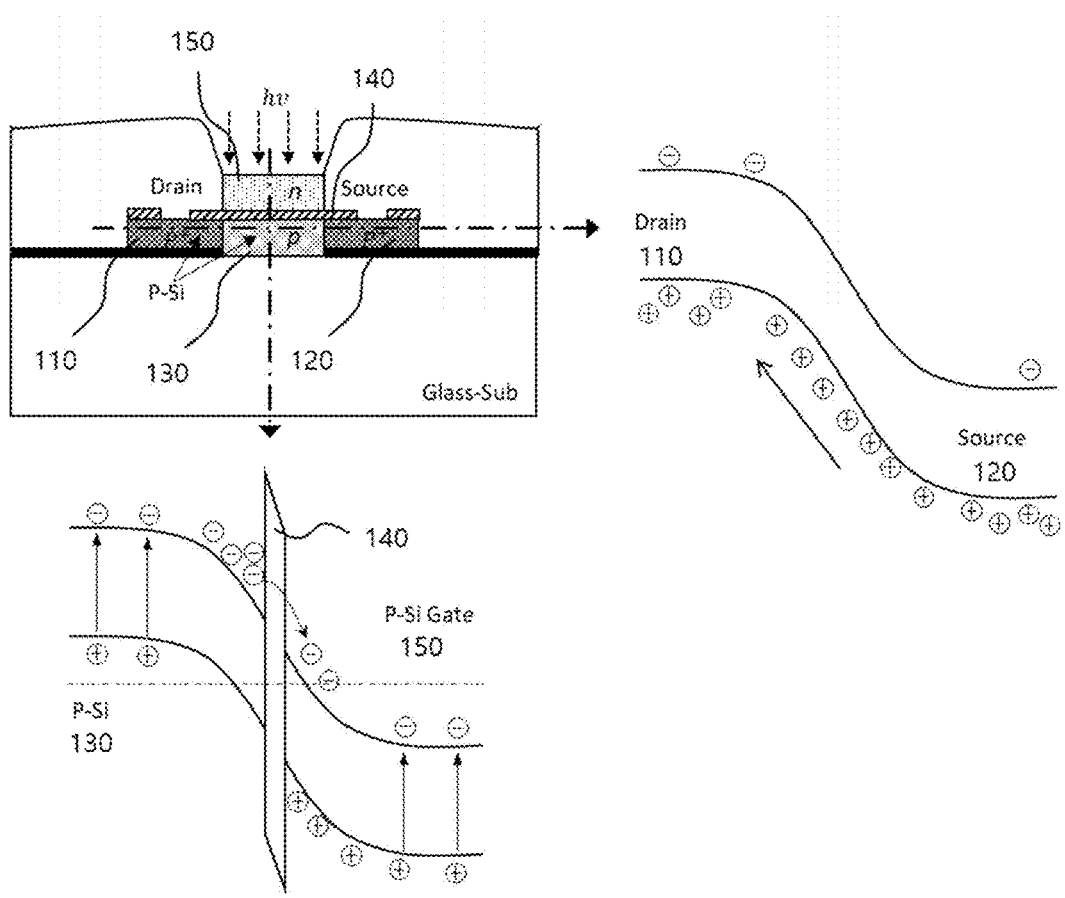
FIG. 6 is an energy band diagram illustrating a photo-electric conversion mechanism of a TFT photodetector according to an embodiment of the present disclosure.

FIG. 6 is an energy band diagram referred to for describing a photoelectric conversion mechanism of a TFT photodetector according to an embodiment of the present disclosure.

When light is incident on the gate 150 as the light receiving part, EHPs are generated in the gate 150 and the active layer 130. Excited electrons of the active layer 130 tunnels through the insulating oxide film 140 by an electric field, thereby depleting a bottom end portion of the gate 150. As a result, the total charge amount of the gate 150 is changed, which leads to a threshold voltage modulation effect equivalent to application of a negative power source to the gate 150. Accordingly, a current channel is formed in the active layer 130 of poly-Si, and thus current flows between the source 120 and the drain 110. The TFT photodetector 100 implemented based on this structure and principle has a high-sensitivity detection capability of sensing even a single photon and enables very intense photocurrent to flow, even with a small amount of light.

Figure 7:
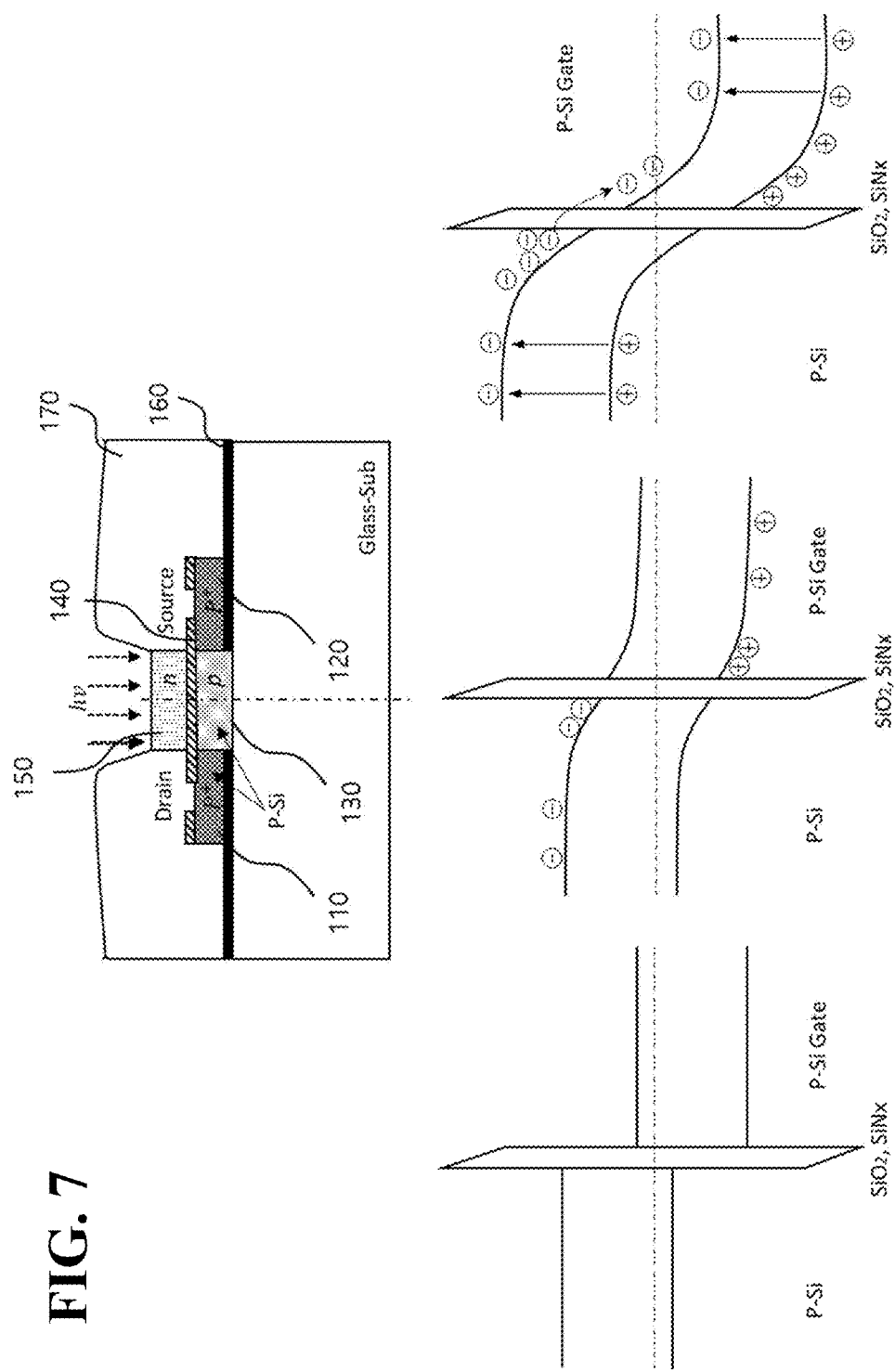
FIG. 7 is an energy band diagram illustrating a tunneling mechanism of a TFT photodetector according to an embodiment of the present disclosure.

FIG. 7 is an energy band diagram referred to for describing a tunneling mechanism of a TFT photodetector according to an embodiment of the present disclosure.

In the TFT photodetector 100, the shielding layer 170 is formed such that only the active layer 130 facing the shielding layer 170 with the gate 150 serving as the light receiving part and the insulating oxide film 140 in between is affected by light, with no effect of light on the remaining area. The shielding layer 170 may be formed by a silicide and metal process, and may not be formed on the gate 150 through a mask.

Light of multiple wavelengths incident on the TFT photodetector 100 is mostly transmitted through or absorbed to the gate 150 formed of poly-Si or a-Si.

If the thickness of the gate 150 is equal to or larger than a predetermined value, for example, 300 nm, short-wavelength light of the blue family in light incident on the TFT photodetector 100 is mostly absorbed to the gate 150, while only very partial short-wavelength light reaches the active layer 130 under the gate 150.

As described above, since the TFT photodetector 100 has an excellent high-sensitivity detection capability compared to a conventional photodetector, even though only a very small part of light of a short wavelength incident on the gate 150 is transmitted through the gate 150 and reaches the active layer 130, the threshold voltage of the current channel is changed and thus even a slight change in light may be sensed.

Light of the other wavelengths is also transmitted through the gate 150 and reaches the active layer 130 in the same principle. Accordingly, the same phenomenon as observed from reception of light of a short wavelength occurs to the gate 150, thereby causing a change in the threshold voltage of the current channel. However, because light of a relatively long wavelength is easily transmitted through the gate 150 and reaches the active layer 130, compared to light of a short wavelength, the light of a long wavelength generates more EHPs in the active layer 130. Therefore, more electrons migrate to the gate 150 through the insulating oxide film 140 by tunneling, causing a change in the threshold voltage of the current channel between the source 120 and the drain 110.

The metal protection layer 160 formed between the transparent substrate 342 and the active layer 130 blocks light introduced through the transparent substrate 342 from reaching an area other than the active layer 130. Therefore, the light is absorbed only to or transmitted only through the active layer 130 contacting the gate 150, and thus efficient tunneling through the insulating oxide film 140 occurs.

For more efficient tunneling, a predetermined voltage may be applied between the gate 150 of poly-Si and the active layer 130 of poly-Si, or a property such as dark current may be adjusted by adjusting a tunneling probability and controlling an initial threshold voltage of the TFT photodetector 100.

Then, when the intensity of light is decreased or light is blocked, tunneled electrons are re-tunneled to the active layer 130, and thus the amount of charge in the gate 150 returns to an original level. Accordingly, the formed depletion layer is reduced and, at the same time, photocurrent generated in the current channel is also reduced.

However, it may occur that charges have not completely disappeared and thus have remained in the active layer 130 even after the light blocking, causing an error such as a signal delay in the next light irradiation. To avert this problem, the thickness of the active layer 130 may be controlled such that an area remaining as an intermediate area, in which no channel is generated, may be reduced, or a reset device may be added to remove the charges remaining in the active layer 130.

Figure 8:
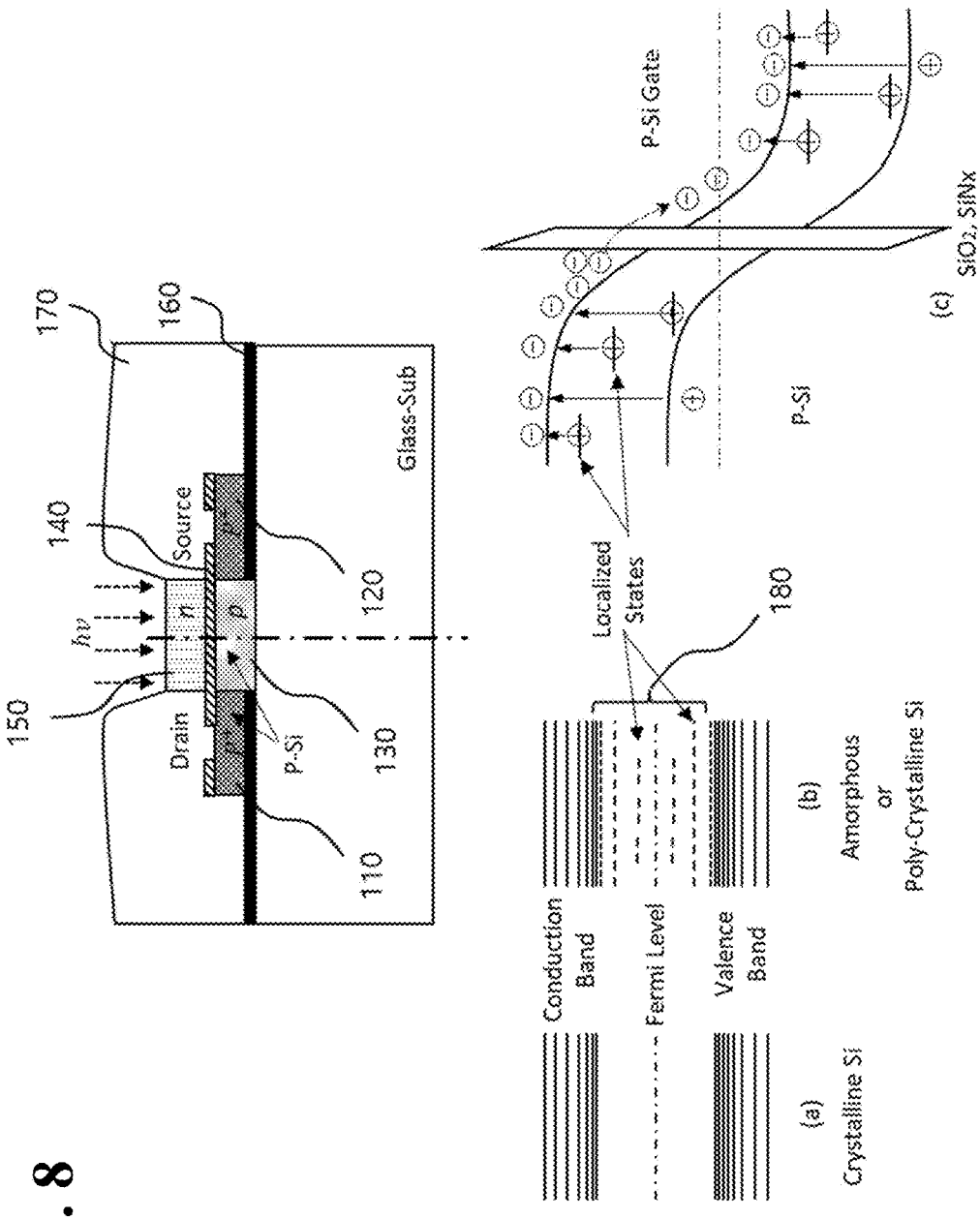
FIG. 8 is a diagram illustrating a photo-electric conversion mechanism caused by a plurality of localized states in a TFT photodetector formed of amorphous silicon (a-Si) or polycrystalline silicon (poly-Si)

FIG. 8 illustrates a mechanism for photoelectric conversion caused by a plurality of localized states in a TFT photodetector formed of a-Si or poly-Si.

FIG. 8(*a*) illustrates the energy band of general single crystalline silicon, and FIG. 8(*b*) illustrates the energy bands of the gate and the active layer of a TFT photodetector of a-Si or poly-Si.

In the TFT photodetector 100, electrons are introduced into the N-type gate 150 by tunneling from the P-type active layer 130 to the insulating oxide film 140, among charges of the two PN areas excited with the insulating oxide layer 140 in between, the electron migration changes the threshold voltage of the current channel between the source 120 and the drain 110 in correspondence with a change in the total amount of charge in the gate 150, the threshold voltage modulation effect caused by the change in the amount of charge in the light receiving part causes a change in the conductance of the current channel, and thus photocurrent corresponding to the changed conductance flows.

As the gate 150 as the light receiving part and the active layer 130 are formed of a-SI or poly-Si, instead of single crystalline silicon, according to an embodiment of the present disclosure, a plurality of localized energy levels are formed in the gate 150 and the active layer 130, thereby forming a wavelength extension layer 180 that extends the wavelength range of light absorbed by the TFT photodetector 100.

The wavelength extension layer 180 is formed of a-Si/poly-Si. As illustrated in FIG. 8(*b*), a plurality of local energy levels are generated through multiple localized states formed in a forbidden band between the conduction band and valence band of the gate 150 and the active layer 130. The localized states are naturally generated in the forbidden band in view of the nature of the a-Si/poly-Si structure, which obviates the need for applying stress or implanting ion to artificially form the localized states. Therefore, processes are simplified.

Accordingly, the TFT photodetector 100 may generate EHPs by absorbing light even at an energy level lower than 1.12 eV which is the band gap energy of the general single crystalline silicon, thereby enabling detection of the wavelength range of the near-infrared area, which is longer than a maximum detectable wavelength of silicon, 1150 nm, and detection of light of a wavelength that a general silicon photodiode is not capable of detecting.

As described above, because the TFT photodetector 100 is formed of a-Si or poly-Si, compared to a conventional photodetector formed of single crystalline silicon, the wavelength extension layer 180 including multiple localized states in the forbidden band exists, and there is no need for artificially forming localized states by applying uniaxial tensile stress on single crystalline silicon, combining hetero elements (e.g., Ge or the like), implanting ions (e.g., P, B, N, Ga, or the like), or increasing the doping density of an oxide film, poly-Si, and/or a substrate to control a thermal process strength. Therefore, a fabrication process is simplified.

As described before, the TFT photodetector 100 according to the embodiment of the present disclosure may generate a flow of photocurrent with an intensity higher than the conventional photodetector by hundreds of times to a few thousands of times, for the same light intensity.

Further, because the TFT photodetector 100 according to the embodiment of the present disclosure includes a plurality of localized states, the wavelength range in which a valid signal is detectable is extended. Thus, the TFT photodetector 100 is applicable to a sensor for biometric recognition, motion recognition, or the like.

While the TFT photodetector 100 has been described as implemented in a similar structure to a P-channel metal-oxide semiconductor (PMOS), this should not be construed as limiting. The TFT photodetector 100 may be implemented in a similar structure to an N-channel metal-oxide semiconductor (NMOS) by exchanging the doping impurities of the gate and the active layer.

With reference to FIGS. 9 to 14, a unit pixel including a TFT photodetector 100 will be described below in detail.

When a PAT-PD pixel is formed on a substrate by the above-described TFT process, various pixel structures may be used according to the thickness of an active layer.

The substrate may be a glass substrate or a flexible substrate such as a PI film.

The active layer may contain a material with a conductive property controllable by tunneling or an electric field. For example, the active layer may contain at least one of a-Si or poly-Si.

According to the present disclosure, a transparent display panel capable of displaying and image sensing may be realized by vertically stacking a screen panel of a display and an image sensing panel or arranging the screen panel of the display and the image sensing panel on the same panel.

Further, according to the present disclosure, a switching TFT for display and a driving TFT for image sensing may be fabricated in a single process by arranging the screen panel and the image sensing panel on the same panel.

Embodiments of the structure of a unit pixel according to the thickness of an active layer will be described with reference to FIGS. 9 to 12.

The pixel structure may vary based on a reference thickness value of the active layer, for example, 100 nm.

Figure 9:
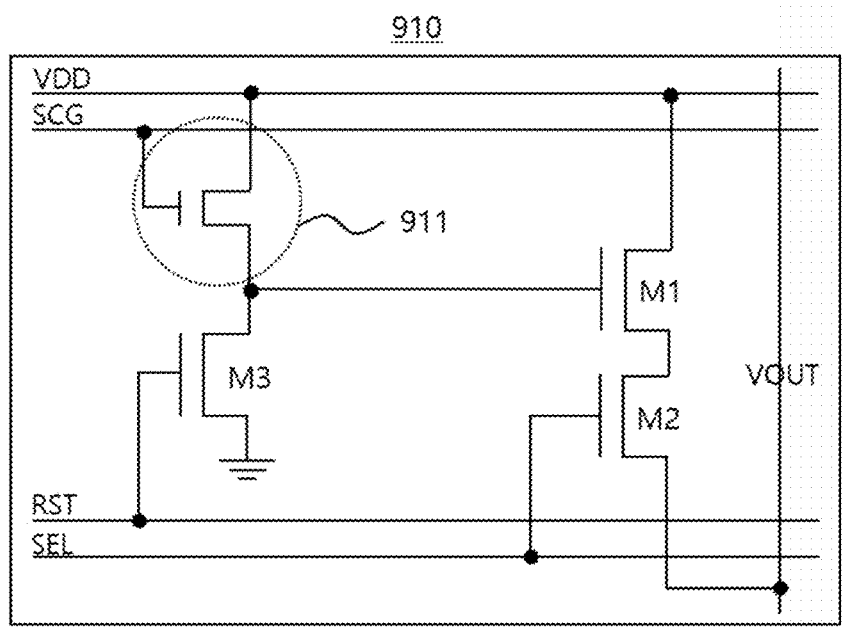
FIGS. 9 and 10 are diagrams illustrating unit pixels, when the thickness of an active layer is equal to or less than 100 nm.
Figure 10:
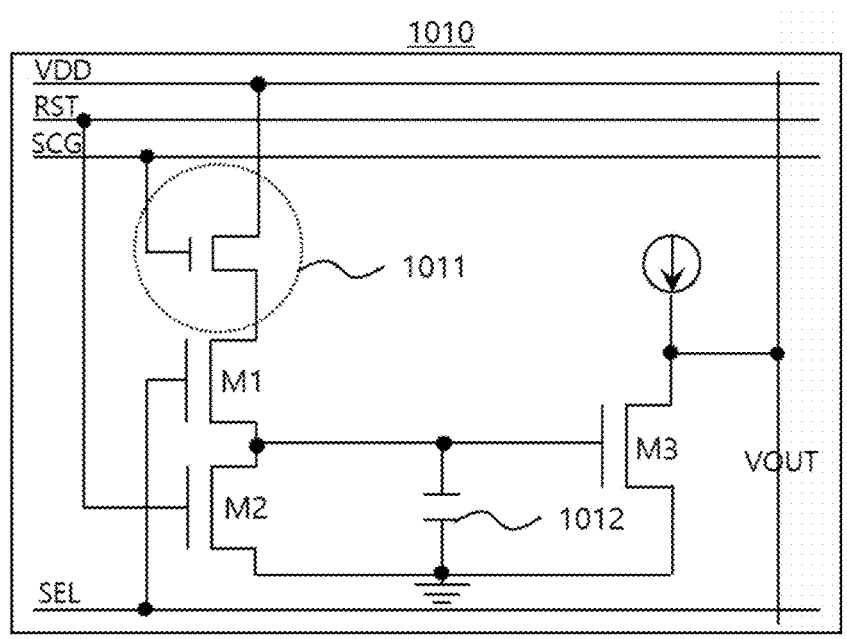

FIGS. 9 and 10 are diagrams illustrating unit pixels, when the thickness of an active layer is 100 nm or less.

A unit pixel 910 may include a TFT photodetector 911 including an active layer formed of a-Si or poly-Si on an amorphous transparent substrate, and at least one transistor. In the embodiment of FIG. 9, the unit pixel 910 may include transistors M1, M2 and M3 as the at least one transistor.

When light is incident on the TFT photodetector 911, electrons may be introduced into an N-type gate by tunneling from a P-type active layer to an oxide film, among charges of two PN areas excited with the oxide film in between. Further, the migration of the electrons changes the threshold voltage of a current channel between a source and a drain in correspondence with a change in the total amount of charge in the gate in the TFT photodetector 911. Further, photocurrent proportional to the intensity of the received light flows in the active layer according to the changed threshold voltage in the TFT photodetector 911. The TFT photodetector 911 may convert the flowing photocurrent to a voltage output. The transistors M1, M2, and M3 may be electrically coupled to the TFT photodetector 911 and generate a voltage output from the photocurrent generated from the active layer of the TFT photodetector 911.

In FIG. 9, the unit pixel 910 may convert photocurrent into a voltage output, using parasitic capacitance generated from the at least one transistor.

Specifically, the unit pixel 910 may convert photocurrent into a voltage output, using parasitic capacitance generated between the transistors M1 and M3.

The transistor M2 is a select transistor which may control charging of a parasitic capacitor.

Specifically, when the select transistor is turned on, the parasitic capacitor may be charged with photocurrent resulting from photoelectric conversion of the TFT photodetector 911. The photocurrent charged in the parasitic capacitor may be realized as an image.

The select transistor M2 may reset signals, when RST is turned on in the turn-on state of the select transistor M2.

Specifically, when RST is turned on with the transistor M2 turned on, charges may be removed from total column buses and the TFT photodetector 911 through a ground GND.

An integration time required for an actual image sensor may be defined by this operation, and continuous images may be obtained in a shutter scheme.

FIG. 10 illustrates a unit pixel 1010 that directly charges a capacitor, instead of parasitic capacitance.

Specifically, the unit pixel 1010 may directly charge a capacitor 1012 coupled to a source follower with photocurrent generated from a TFT photodetector 1011.

When light is incident on the TFT photodetector 1011, electrons may be introduced into an N-type gate by tunneling from a P-type active layer to an oxide film, among charges of two PN areas excited with the oxide film in between. Further, the migration of the electrons changes the threshold voltage of a current channel between a source and a drain in correspondence with a change in the total amount of charge in the gate in the TFT photodetector 1011. Further, photocurrent proportional to the intensity of the received light flows in the active layer according to the changed threshold voltage in the TFT photodetector 1011. The TFT photodetector 1011 may convert the flowing photocurrent into a voltage output. Transistors M1, M2, and M3 may be electrically coupled to the TFT photodetector 1011 and generate a voltage output from the photocurrent generated from the active layer of the TFT photodetector 1011.

In the embodiment of FIG. 10, larger capacitance than parasitic capacitance may be used by means of a capacitor 1012. Further, as the large capacitance is controllable, the output characteristics of a wider dynamic range than in the embodiment of FIG. 9 may be achieved.

In the embodiment of FIG. 10, at least one transistor may include a select transistor M1.

When the select transistor M1 is turned on, the capacitor 1012 of an IVC circuit among capacitors coupled to a transistor corresponding to a source follower may be charged.

Specifically, the capacitor 1012 of the IVC circuit within the pixel may be charged with photocurrent resulting from photoelectric conversion of the TFT photodetector 1011 due to turn-on of the select transistor M1.

The photocurrent charged in the capacitor 1012 may be converted into a voltage and output as VOUT. The voltage VOUT may be provided in the form of a signal to a separate driving circuit such as a co-double sampling (CDS) circuit.

The signal may be reset by the select transistor M1.

For example, when RST (M2) is turned on with the select transistor M1 turned on, charges may be removed from the capacitor 1012 of the IVC circuit, total column buses, and the TFT photodetector 1011 through a ground GND.

An integration time required for an actual image sensor may be defined by this operation, and continuous images may be obtained in a shutter scheme.

For example, the TFT photodetector 1011 used in FIG. 10 may be formed in a poly-Si active layer of a thickness less than 100 nm on a glass substrate. Therefore, a perfectly depleted current channel area may be realized.

Further, the formation of the perfectly depleted current channel area in the TFT photodetector 1011 obviates the need for using a separate detector transistor for resetting.

Figure 11:
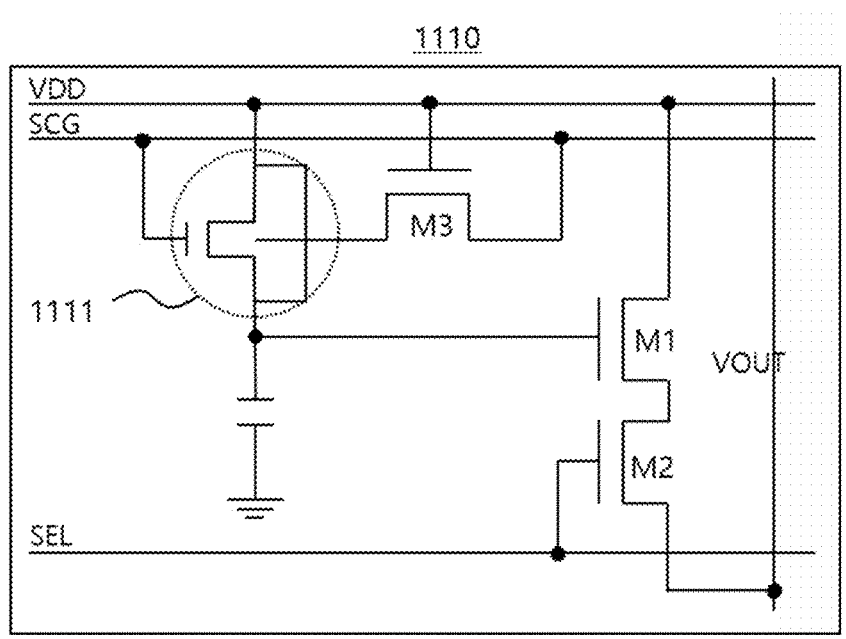
FIGS. 11 and 12 are diagrams illustrating unit pixels, when the thickness of an active layer is equal to or larger than 100 nm.
Figure 12:
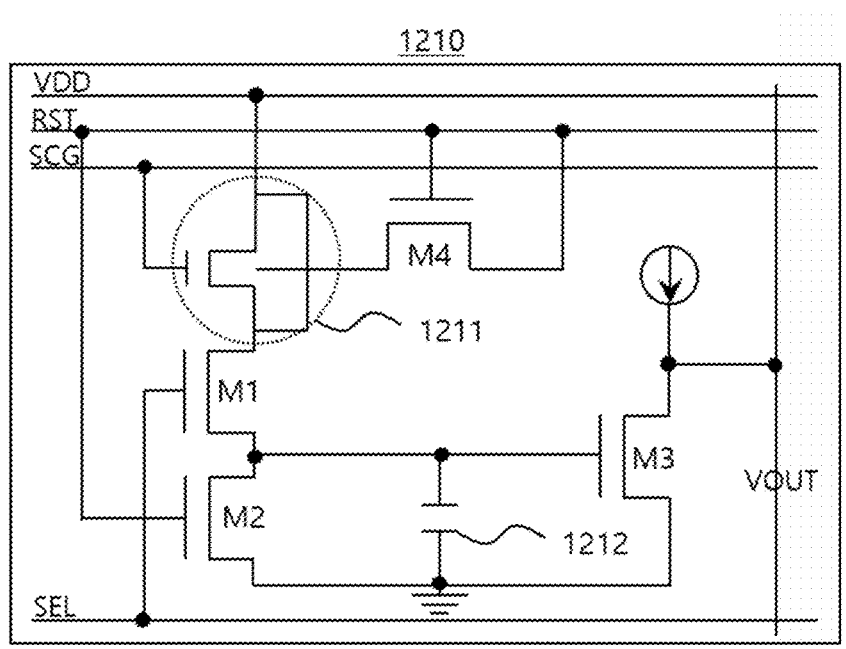

FIGS. 11 and 12 are diagrams illustrating unit pixels, when the thickness of an active layer is equal to or larger than 100 nm.

When a poly-Si active layer is fabricated to a thickness equal to or larger than 100 nm on a glass substrate in a fabrication process, a neutral area is separately formed in a lower part of a gate, which is not completely depleted, aside from a current channel generated by light.

Unnecessary extra charges generated by light may be accumulated in this neutral area. The accumulated charges are likely to act as a factor that changes a threshold voltage which changes linearly by light.

The residual charges may be controlled by directly coupling a separate transistor to the active layer.

For this purpose, referring to FIG. 11, a unit pixel 1110 includes a TFT photodetector 1111 with a poly-Si active layer formed to a thickness equal to or larger than 100 nm.

When light is incident on the TFT photodetector 1111, electrons may be introduced into an N-type gate by tunneling from a P-type active layer to an oxide film, among charges of two PN areas excited with the oxide film in between. Further, the migration of the electrons changes the threshold voltage of a current channel between a source and a drain in correspondence with a change in the total amount of charge in the gate in the TFT photodetector 1111. Further, photocurrent proportional to the intensity of the received light flows in the active layer according to the changed threshold voltage in the TFT photodetector 1111. The TFT photodetector 1111 may convert the flowing photocurrent into a voltage output. Transistors M1 and M2 may be electrically coupled to the TFT photodetector 1111 and generate a voltage output from the photocurrent generated from the active layer of the TFT photodetector 1111.

A transistor M3 is directly coupled to the active layer of the TFT photodetector 1111.

The transistor M3 may be configured to include a gate end connected to VDD, a drain end connected to the active layer of the TFT photodetector 1111, and a source end connected to SCG. That is, as VDD is input to the gate end, unnecessary extra residual charges accumulated in the poly-Si active layer of the TFT photodetector 1111 may flow from the drain end to the source end and may be controlled through an SCG channel.

Referring to FIG. 12, a unit pixel 1210 includes a TFT photodetector 1211 with a poly-Si active layer formed to a thickness equal to or larger than 100 nm.

When light is incident on the TFT photodetector 1211, electrons may be introduced into an N-type gate by tunneling from a P-type active layer to an oxide film, among charges of two PN areas excited with the oxide film in between. Further, the migration of the electrons changes the threshold voltage of a current channel between a source and a drain in correspondence with a change in the total amount of charge in the gate in the TFT photodetector 1211. Further, photocurrent proportional to the intensity of the received light flows in the active layer according to the changed threshold voltage in the TFT photodetector 1211. The TFT photodetector 1211 may convert the flowing photocurrent into a voltage output. Transistors M1, M2 and M3 may be electrically coupled to the TFT photodetector 1211 and generate a voltage output from the photocurrent generated from the active layer of the TFT photodetector 1211.

A transistor M4 is directly coupled to the active layer of the TFT photodetector 1211.

The transistor M4 may be configured to include a gate end connected to RST, a drain end connected to the active layer of the TFT photodetector 1211, and a source end connected to RST. That is, as RST is input to the gate end, unnecessary extra residual charges accumulated in the poly-Si active layer of the TFT photodetector 1211 may flow from the drain end to the source end and thus may be reset.

FIG. 12 illustrates a unit pixel 1210 that directly charges a capacitor 1212, instead of parasitic capacitance.

Specifically, the unit pixel 1210 may directly charge the capacitor 1212 coupled to a source follower with photocurrent generated from the TFT photodetector 1211.

In the embodiment of FIG. 12, larger capacitance than parasitic capacitance may be used by means of the capacitor 1212. Further, as the large capacitance is controllable, the output characteristics of a wider dynamic range may be achieved.

The capacitor 1212 of the IVC circuit within the pixel may be charged with photocurrent resulting from photoelectric conversion of the TFT photodetector 1211 due to turn-on of the select transistor M1.

The photocurrent charged in the capacitor 1212 may be converted into a voltage and output as VOUT. The voltage VOUT may be provided in the form of a signal to a separate driving circuit such as a CDS circuit.

The signal may be reset by the select transistor M1.

For example, when RST (M2) is turned on with the select transistor M1 turned on, charges may be removed from the capacitor 1212 of IVC, total column buses, and the TFT photodetector 1211 through a ground GND.

When the unit pixel 1110 or 1210 is used, a light source for the display may also be used as a light source for an image sensor. Further, the BLU of an LCD or a light emitting source of an OLED may also be used. Further, it is possible to detect light in the wavelength range of the near-infrared area, which is longer than a maximum detectable wavelength of general silicon, 1150 nm.

Figure 13:
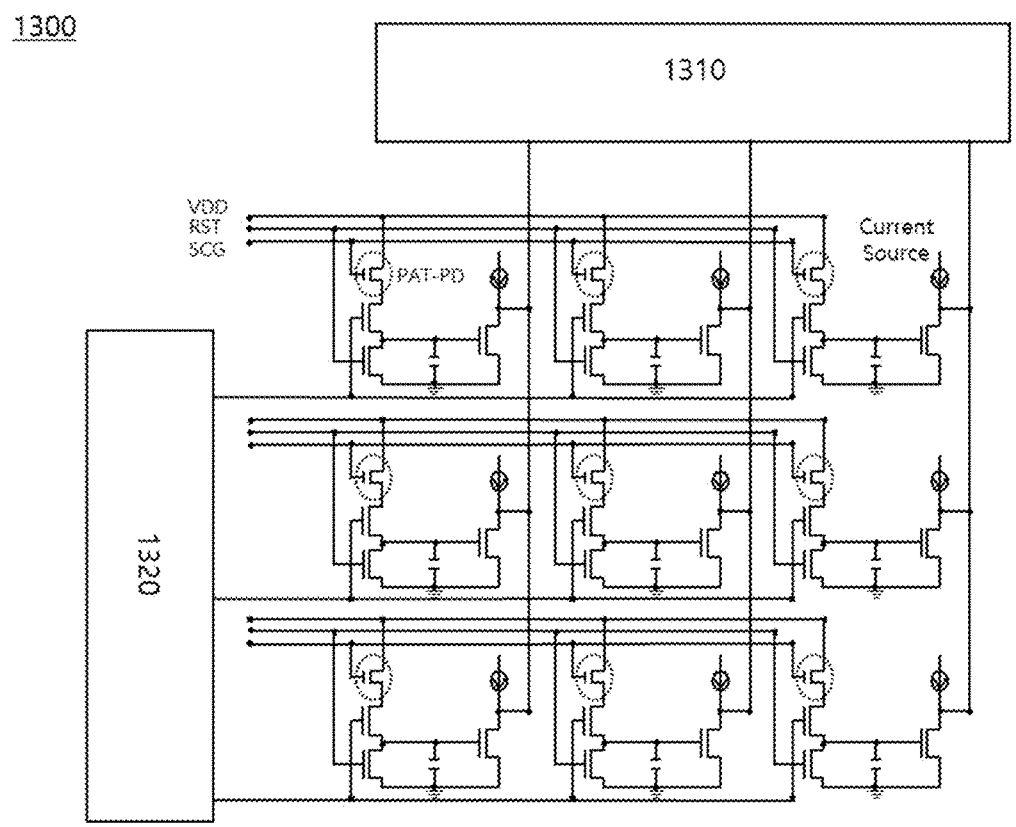
FIG. 13 is a diagram illustrating an active pixel system (APS)-type cell array in which unit pixels are arranged to provide a voltage output to a driving circuit.

FIG. 13 is a diagram illustrating an active pixel system (APS)-type cell array in which unit pixels are arranged to output a voltage to a driving circuit.

A display panel may be formed by arranging multiple unit pixels as illustrated in FIGS. 9 to 12 in an array. An image signal may be generated by the thus-formed screen panel.

Referring to FIG. 13, a two-dimensional image may be obtained from unit pixels according to an embodiment of the present disclosure. The unit pixels may be arranged in an array, as illustrated in FIG. 13. Further, an image signal may be obtained by a horizontal scanner 1310 for detecting a signal of each column, a vertical scanner 1320 for detecting a signal of each row, and an analog signal driving circuit including an analog-to-digital converter (ADC), which is coupled to each scanner. Particularly, a scheme of providing a voltage output of each unit pixel to the driving circuit corresponds to an APS.

The APS is robust against external noise.

The driving circuit may be installed outside the screen panel, apart from an array of unit pixels, and may further include circuits such as a BLC, CDS, PGA, S&H, PLL, and ADC.

Figure 14:
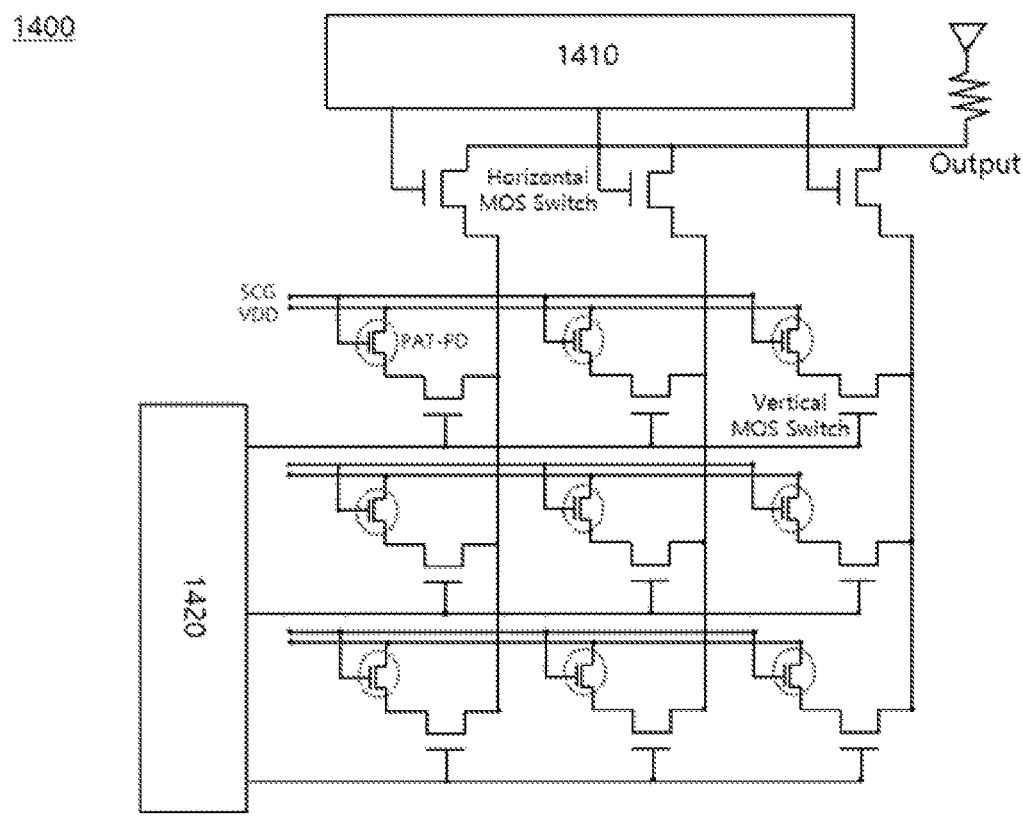
FIG. 14 is a diagram illustrating a passive pixel system (PPS)-type cell array in which unit pixels are arranged to provide a current output to a driving circuit Throughout the drawings, like reference numerals will be understood to refer to like parts, components, and structures.

FIG. 14 is a diagram illustrating a passive pixel system (PPS)-type cell array in which unit pixels are arranged to provide a current output to a driving circuit according to an embodiment of the present disclosure.

Referring to FIG. 14, a two-dimensional image may be obtained from unit pixels according to an embodiment of the present disclosure. The unit pixels may be arranged in an array, as illustrated in FIG. 14. Further, an image signal may be obtained by a horizontal scanner 1410 for detecting a signal of each column, a vertical scanner 1420 for detecting a signal of each row, and an analog signal driving circuit including an ADC, which is coupled to each scanner. Particularly, a scheme of providing a voltage output of each unit pixel to the driving circuit corresponds to a PPS.

The PPS is a structure capable of a high-sensitivity image in a wide dynamic range.

The driving circuit may include circuits such as an IVC, BLC, CDS, PGA, S&H, PLL, and ADC.

As is apparent from the foregoing description, according to various embodiments of the present disclosure, a high-sensitivity image sensor may be realized on a glass substrate or a flexible substrate such as a PI film, which is used as a display panel, by a TFT fabrication technology.

According to an embodiment, the display module may function as an image sensor, which obviates the need for providing a separate image sensor on a display panel.

According to an embodiment, a switching TFT for display and a driving TFT for image sensing may be fabricated in a single process by arranging a screen panel and an image sensing panel on the same panel.

According to an embodiment, a light source for a display may also be used as a light source for an image sensor.

According to an embodiment, as both of a BLU of an LCD and a light emitting source of an OLED may be used, image sensing may be processed without the need for providing a separate light emitting part required for an image sensor.

According to an embodiment, it is possible to detect light in the wavelength range of the near-infrared area, which is longer than a maximum detectable wavelength of general silicon, 1150 nm.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

What is claimed is:

1. A unit pixel arranged along with a display pixel in each pixel of a display panel, the unit pixel comprising:
  a thin-film transistor (TFT) photodetector including an active layer formed of amorphous silicon or polycrystalline silicon on an amorphous transparent substrate; and
  at least one transistor electrically coupled to the TFT photodetector and configured to generate a voltage output from photocurrent generated from the active layer,
  wherein the at least one transistor converts the photocurrent into the voltage output based on parasitic capacitance between the at least one transistor, caused by the photocurrent generated from the active layer.

2. The unit pixel of claim 1, wherein the TFT photodetector is configured in a structure in which when light is incident, electrons are introduced into an N-type gate by tunneling from a P-type active layer to an insulating oxide film, among charges of two PN areas excited with the insulating oxide film in between, the electron migration changes a threshold voltage of a current channel between a source and a drain in correspondence with a change in the total amount of charge in the gate, the photocurrent proportional to the intensity of the received light flows in the active layer, and the voltage output is generated from the flowing photocurrent.

3. The unit pixel of claim 1, wherein the active layer contains a material with a conductive property controllable by tunneling or an electric field.

4. The unit pixel of claim 3, wherein the active layer contains at least one of amorphous silicon or polycrystalline silicon.

5. The unit pixel of claim 1, wherein the at least one transistor includes a select transistor, and
  wherein when the select transistor is turned on, the parasitic capacitance is generated.

6. A unit pixel, arranged along with a display pixel in each pixel of a display panel, the unit pixel comprising:
  a thin-film transistor (TFT) photodetector including an active layer formed of amorphous silicon or polycrystalline silicon on an amorphous transparent substrate; and
  at least one transistor electrically coupled to the TFT photodetector and configured to generate a voltage output from photocurrent generated from the active layer,
  wherein the at least one transistor converts photocurrent into the voltage output, the photocurrent being generated by directly charging a capacitor coupled to a transistor corresponding to a source follower with the photocurrent generated from the active layer.

7. The unit pixel of claim 6, wherein the at least one transistor includes a select transistor, and
  wherein when the select transistor is turned on, a capacitor of an IVC circuit is charged, among capacitors coupled to the transistor corresponding to the source follower, and the charged photocurrent is converted into a voltage which is an output of the IVC circuit.

8. The unit pixel of claim 1, wherein a pixel structure is determined based on a thickness of the active layer.

9. The unit pixel of claim 8, further comprising a transistor coupled to the active layer and configured to control residual charges in a neutral area, when the thickness of the active layer is equal to or larger than a reference value.

10. The unit pixel of claim 9, wherein the reference value is 100 nm.

11. The unit pixel of claim 1, wherein the TFT photodetector comprises:
  an amorphous transparent substrate used as a display panel;
  a source formed of amorphous silicon or polycrystalline silicon on the transparent substrate;
  a drain formed of amorphous silicon or polycrystalline silicon, opposite to the source on the transparent substrate;
  an active layer formed between the source and the drain and having a current 30 channel formed between the source and the drain;
  an insulating oxide film formed on the source, the drain, and the active layer; and
  a light receiving part formed on the insulating oxide film, isolated from the active layer by the insulating oxide film, and configured to absorb light.

12. The unit pixel of claim 11, wherein in the TFT photodetector, when light is incident on the light receiving part, electrons migrate by tunneling through the insulating oxide film between the light receiving part and the active layer which have been excited with the insulating oxide film in between, the amount of charge in the light receiving part is changed by the migration of the electrons, a threshold voltage of the current channel is changed due to the change of the amount of charge, and photocurrent flows through the current channel due to the change of the threshold voltage.

13. The unit pixel of claim 1, wherein the TFT photodetector uses light generated from the display panel as a light source for a sensor.

14. A unit pixel of a display panel, comprising:
a display sub-panel including a light emitting device; and
an image sensor sub-panel stacked with the display sub-panel, and configured to generate a voltage output from photocurrent generated from an active layer in response to sensed light,
wherein the image sensor sub-panel comprises:
- a thin-film transistor (TFT) photodetector including an active layer formed of amorphous silicon or polycrystalline silicon on an amorphous transparent substrate; and
- at least one transistor electrically coupled to a source side of the TFT photodetector and configured to generate a voltage output from photocurrent generated from the active layer,
- wherein the at least one transistor converts the photocurrent into the voltage output based on parasitic capacitance between the at least one transistor, caused by the photocurrent generated from the active layer.

15. The unit pixel of claim 14, wherein the image sensor sub-panel is configured in a structure in which when light is incident, electrons are introduced into an N-type gate by tunneling from a P-type active layer to an insulating oxide film, among charges of two PN areas excited with the insulating oxide film in between, the electron migration changes a threshold voltage of a current channel between a source and a drain in correspondence with a change in the total amount of charge in the gate, the photocurrent proportional to the intensity of the received light flows in the active layer, and the voltage output is generated from the flowing photocurrent.

\* \* \* \* \*